(12) United States Patent
Hong

(10) Patent No.: US 10,255,864 B2
(45) Date of Patent: Apr. 9, 2019

(54) DEMUX CONTROL CIRCUIT

(71) Applicant: Wuhan China Star Optoelectronics Technology Co., Ltd., Wuhan, Hubei (CN)

(72) Inventor: Guanghui Hong, Hubei (CN)

(73) Assignee: WUHAN CHINA STAR OPTOELECTRONICS TECHNOLOGY CO., LTD., Wuhan, Hubei (CN)

(*) Notice: Subject to any disclaimer, the term of this patent is extended or adjusted under 35 U.S.C. 154(b) by 0 days.

(21) Appl. No.: 15/571,011

(22) PCT Filed: Oct. 19, 2017

(86) PCT No.: PCT/CN2017/106900
§ 371 (c)(1),
(2) Date: Oct. 31, 2017

(65) Prior Publication Data
US 2019/0027102 A1    Jan. 24, 2019

(30) Foreign Application Priority Data
Jul. 24, 2017 (CN) .......................... 2017 1 0608570

(51) Int. Cl.
G09G 3/36 (2006.01)
H03K 19/20 (2006.01)
H03K 5/135 (2006.01)

(52) U.S. Cl.
CPC .............. *G09G 3/36* (2013.01); *H03K 5/135* (2013.01); *H03K 19/20* (2013.01); *G09G 2310/0297* (2013.01)

(58) Field of Classification Search
CPC ... G09G 2310/0297; G09G 2310/0275; G09G 3/3685
See application file for complete search history.

(56) References Cited

U.S. PATENT DOCUMENTS

| | | | | |
|---|---|---|---|---|
| 5,982,703 A * | 11/1999 | Oh | ....................... | G11C 7/1027 |
| | | | | 365/189.05 |
| 2006/0044236 A1* | 3/2006 | Kim | ..................... | G09G 3/3233 |
| | | | | 345/82 |
| 2007/0057877 A1* | 3/2007 | Choi | .................... | G09G 3/3233 |
| | | | | 345/76 |
| 2016/0125783 A1* | 5/2016 | Huang | ................ | G09G 3/2003 |
| | | | | 345/694 |
| 2018/0151145 A1* | 5/2018 | Lee | ................... | G02F 1/136286 |

* cited by examiner

*Primary Examiner* — Koosha Sharifi-Tafreshi
(74) *Attorney, Agent, or Firm* — Hauptman Ham, LLP

(57) ABSTRACT

The present application provides a demux control circuit. The demux control circuit includes a driving chip, a logic circuit, and a demux for providing two or three pulse signals to the logic circuit, the logic circuit including a plurality of NOR Gate and a plurality of buffers which can convert two pulse signals into three control signals or convert the three pulse signals into four control signals through the cooperation of the NOR gates and the buffers to achieve outputting a larger number of control signals by a smaller number of pins, thereby reducing the number of pins outputted from the driving chip and reduce production costs.

11 Claims, 12 Drawing Sheets

DEMUX CONTROL CIRCUIT

RELATED APPLICATIONS

The present application is a National Phase of International Application Number PCT/CN2017/106900, filed Oct. 19, 2017, and claims the priority of China Application No. 201710608570.2, filed Jul. 24, 2017, the full disclosure of which is incorporated herein by reference.

FIELD OF THE DISCLOSURE

The disclosure relates to a display technical field, and more particularly to a demux control circuit.

BACKGROUND

With the development of display technology, liquid crystal display, LCD and other flat panel display device with the advantages of high quality, power saving, thin body and wide application filed are widely used in mobile phones, television, personal digital assistants, digital cameras, notebook, desktop computers and other consumer electronics products, and become a mainstream in the display devices.

Most of the liquid crystal display devices in the market are backlight type liquid crystal displays, and include liquid crystal display panels and backlight modules. The working principle of the liquid crystal display panel is disposing liquid crystal molecules in two parallel glass substrates, there are many vertical and horizontal small wires between the two glass substrates, the liquid crystal molecules is controlled to change the direction through the power or not to reflect the light from the backlight module to produce the image.

In general, the liquid crystal display panel is composed of a color filter substrate (CF), a thin film transistor substrate (TFT), a liquid crystal (LC) sandwiched between the color film substrate and the thin film transistor substrate, and a sealant frame, the manufacturing process is generally included: a front-end array process including thin-film, lithography, etching and stripping, a middle-end cell process including bonding the TFT substrate and CF substrate and a back-end module assembly process including a driving IC and laminating a printed circuit board. Wherein, the front-end array process is mainly to form the TFT substrate, in order to control the movement of the liquid crystal molecules; the middle-end cell process is mainly in adding the liquid crystal molecules between the TFT substrate and the CF substrate; the back-end module assembly process is mainly laminating the driving IC and the integration of the printed circuit board, and then driving the liquid crystal molecules to rotate, displaying the image.

A demux is a circuit for reducing the number of output pins of the driving integrated circuit, IC in the array process of the liquid crystal display panel. Generally, the demux includes: an input terminal, a plurality of output terminals, and a plurality of switching elements electrically connected to the input terminal and the plurality of output terminals, respectively; the input terminal is for receiving an input signal from the driving IC, the plurality of output terminals is for inputting the input signal to a plurality of data lines, respectively; the switching elements turning on or turning off the output terminals; in order to control the turning on or turning off the output terminals, it is necessary to obtain a plurality of control signals from the driving IC to control the switching elements, to realize the turning on or turning off the output terminals by the on or off of the switching elements; in accordance with the specific types of the switching elements, each of the switching elements need at least one control signal, and each control signal needs a separate pin disposed in the driving IC for outputting, in the high-resolution thin film transistor liquid crystal display, the case of the numbers of pin in driving IC is a big challenge, and it may also increase the cost of the product.

SUMMARY

The object of the present application is to provide a demux control circuit capable of converting two pulse signals outputted from a driving chip into three pulse signals or converting the three pulse signals outputted from the driving chip into four control signals, to achieve outputting a larger number of control signals by a smaller number of pins, thereby reducing the number of pins outputted from the driving chip and reduce production costs.

In order to achieve the above object, the present application provides a demux control circuit including: a driving chip, a logic circuit electrically connected to the driving chip, and a demux electrically connected to the logic circuit;

The driving chip for providing a first pulse signal and a second pulse signal to the logic circuit;

The logic circuit including a first two-input NOR gate, a second two-input NOR gate, a third two-input NOR gate, a first in-phase buffer, a second in-phase buffer, and a third in-phase buffer;

A first input terminal and a second input terminal of the first two-input NOR gate respectively accessing the first pulse signal and the second pulse signal, an output terminal electrically connected to an input terminal of the first in-phase buffer; a first input terminal of the second two-input NOR gate accessing the first pulse signal, a second input terminal electrically connected to the output terminal of the first two-input NOR gate, and an output terminal electrically connected to an input terminal of the second in-phase buffer, a first input terminal of the third two-input NOR gate accessing the second pulse signal, and a second input terminal electrically connected to the output terminal of the first two-input NOR gate, an output terminal electrically connected to an input terminal of the third in-phase buffer;

Output terminals of the first in-phase buffer, the second in-phase buffer and the third in-phase buffer respectively outputting a first control signal, a second control signal, and a third control signal to the demux.

The logic circuit further includes a first inverter, a second inverter, and a third inverter;

An input terminal of the first inverter is electrically connected to the output terminal of the first two-input NOR gate, an output terminal of the first inverter outputs a first inverting control signal to the demux; an input terminal of the second inverter is electrically connected to the output terminal of the second two-input NOR gate, an output terminal of the second inverter outputs a second inverting control signal to the demux; an input terminal of the third inverter is electrically connected to the output terminal of the third two-input NOR gate, an output terminal of the third inverter outputs a third inverting control signal to the demux.

The demux control circuit further includes a first data line, a second data line, and a third data line;

The demux includes a first thin film transistor, a second thin film transistor, and a third thin film transistor;

Sources of the first thin film transistor, the second thin film transistor, and the third thin film transistor accesses input signals, drains of the first thin film transistor, the second thin film transistor, and the third thin film transistor are respectively electrically connected to the first data line, the second data line, and the third data line, gates of the first thin film transistor, the second thin film transistor, and the third thin film transistor are respectively accessing the first control signal, the second control signal, and the third control signal.

The demux control circuit further includes a first data line, a second data line, and a third data line;

The demux includes a first transmission gate, a second transmission gate, and a third transmission gate;

Input terminals of the first transmission gate, the second transmission gate, and the third transmission gate are all accessing input signals, output terminals are respectively electrically connected to the first data line, the second data line, and the third data line, high potential control terminals are respectively accessing the first control signal, the second control signal, and the third control signal, low potential control terminals are respectively accessing the first inverting control signal, the second inverting control signal, and the third inverting control signal.

A combination of the potentials of the first pulse signal and the second pulse signal generates a plurality of successive signal output cycles, each of the signal output cycle respectively includes a first stage, a second stage, and a third stage conducted successively;

In the first stage, both the first pulse signal and the second pulse signal are at low potential, the first control signal is at high potential, the second control signal and the third control signal are at low potential;

In the second stage, the first pulse signal is at low potential, the second pulse signal is at high potential, the second control signal is at high potential, the first control signal and the third control signal are at low potential;

In the third stage, the first pulse signal is at high potential, the second pulse signal is at low potential, the third control signal is at high potential, the first control signal and the second control signal are at low potential.

The present application provides a demux control circuit, including a driving chip, a logic circuit electrically connected to the driving chip, and a demux electrically connected to the logic circuit;

The driving chip for providing a first pulse signal, a second pulse signal and a third pulse signal to the logic circuit;

The logic circuit including a first three-input NOR gate, a second three-input NOR gate, a third three-input NOR gate, a fourth three-input NOR gate, a first in-phase buffer, a second in-phase buffer, a third in-phase buffer, and a fourth in-phase buffer;

A first input terminal, a second input terminal, and a third input terminal of the first three-input NOR gate respectively accessing the first pulse signal, the second pulse signal, and the third pulse signal, an output terminal electrically connected to an input terminal of the first in-phase buffer; a first input terminal and a second input terminal of the second three-input NOR gate respectively accessing the first pulse signal and the second pulse signal, a third input terminal electrically connected to the output terminal of the first three-input NOR gate, an output terminal electrically connected to an input terminal of the second in-phase buffer; a first input terminal and a second input terminal of the third three-input NOR gate respectively accessing the first pulse signal and the third pulse signal, a third input terminal electrically connected to the output terminal of the first three-input NOR gate, an output terminal electrically connected to an input terminal of the third in-phase buffer; a first input terminal and a second input terminal of the fourth three-input NOR gate respectively accessing the second pulse signal and the third pulse signal, a third input terminal electrically connected to the output terminal of the first three-input NOR gate, an output terminal electrically connected to an input terminal of the fourth in-phase buffer;

Output terminals of the first in-phase buffer, the second in-phase buffer, the third in-phase buffer, and the fourth in-phase buffer respectively outputting a first control signal, a second control signal, a third control signal, and a fourth control signal to the demux.

The logic circuit further includes a first inverter, a second inverter, a third inverter and a fourth inverter;

An input terminal of the first inverter is electrically connected to the output terminal of the first three-input NOR gate, an output terminal of the first inverter outputs a first inverting control signal to the demux; an input terminal of the second inverter is electrically connected to the output terminal of the second three-input NOR gate, an output terminal of the second inverter outputs a second inverting control signal to the demux; an input of the third inverter is electrically connected to the output terminal of the third three-input NOR gate, an output terminal of the third inverter outputs a third inverting control signal to the demux; an input terminal of the fourth inverter is electrically connected to the fourth three-input NOR gate, an output terminal of the fourth inverter outputs a fourth inverting control signal to the demux.

The demux control circuit further includes a first data line, a second data line, a third data line, and a fourth data line;

The demux includes a first thin film transistor, a second thin film transistor, a third thin film transistor, and a fourth thin film transistor;

Sources of the first thin film transistor, the second thin film transistor, the third thin film transistor, and the fourth thin film transistor are all accessing input signals, drains are respectively electrically connected to the first data line, the second data line, the third data line, and the fourth data line, gates are respectively accessing the first control signal, the second control signal, the third control signal and the fourth control signal.

The demux control circuit further includes a first data line, a second data line, a third data line, and a fourth data line;

The demux includes a first transmission gate, a second transmission gate, a third transmission gate, and a fourth transmission gate;

Input terminals of the first transmission gate, the second transmission gate, the third transmission gate, and the fourth transmission gate are all accessing input signals, output terminals are respectively electrically connected to the first data line, the second data line, the third data line, and the fourth data line, high potential control terminals are respectively accessing the first control signal, the second control signal, the third control signal, and the fourth control signal, low potential control terminals are respectively accessing the first inverting control signal, the second inverting control signal, the third inverting control signal, and the fourth inverting control signal.

A combination of the potentials of the first pulse signal, the second pulse signal and the third pulse signal generates a plurality of successive signal output cycles, each of the signal output cycle respectively includes a first stage, a second stage, a third stage, and a fourth stage conducted successively;

In the first stage, all of the first pulse signal, the second pulse signal and the third pulse signal are at low potential, the first control signal is at high potential, the second control signal, the third control signal and the fourth control signal are at low potential;

In the second stage, the first pulse signal and the second pulse signal are at low potential, the third pulse signal is at high potential, the second control signal is at high potential, the first control signal, the third control signal and the fourth control signal are at low potential;

In the third stage, the first pulse signal and the third pulse signal are at low potential, the second pulse signal is at high potential, the third control signal is at high potential, the first control signal, the second control signal and the fourth control signal are at low potential; and In the fourth stage, the second pulse signal and the third pulse signal are at low potential, the first pulse signal is at high potential, the fourth control signal is at high potential, the first control signal, the second control signal and the third control signal are at low potential.

The present application further provides a demux control circuit, including: a driving chip, a logic circuit electrically connected to the driving chip, and a demux electrically connected to the logic circuit;

The driving chip for providing a first pulse signal and a second pulse signal to the logic circuit;

The logic circuit including a first two-input NOR gate, a second two-input NOR gate, a third two-input NOR gate, a first in-phase buffer, a second in-phase buffer, and a third in-phase buffer;

A first input terminal and a second input terminal of the first two-input NOR gate respectively accessing the first pulse signal and the second pulse signal, an output terminal electrically connected to an input terminal of the first in-phase buffer; a first input terminal of the second two-input NOR gate accessing the first pulse signal, a second input terminal electrically connected to the output terminal of the first two-input NOR gate, and an output terminal electrically connected to an input terminal of the second in-phase buffer, a first input terminal of the third two-input NOR gate accessing the second pulse signal, and a second input terminal electrically connected to the output terminal of the first two-input NOR gate, an output terminal electrically connected to an input terminal of the third in-phase buffer;

Output terminals of the first in-phase buffer, the second in-phase buffer and the third in-phase buffer respectively outputting a first control signal, a second control signal, and a third control signal to the demux;

Wherein the logic circuit further includes a first inverter, a second inverter, and a third inverter;

An input terminal of the first inverter is electrically connected to the output terminal of the first two-input NOR gate, an output terminal of the first inverter outputs a first inverting control signal to the demux; an input terminal of the second inverter is electrically connected to the output terminal of the second two-input NOR gate, an output terminal of the second inverter outputs a second inverting control signal to the demux; an input terminal of the third inverter is electrically connected to the output terminal of the third two-input NOR gate, an output terminal of the third inverter outputs a third inverting control signal to the demux:

The demux control circuit further includes a first data line, a second data line, and a third data line;

The demux further includes a first transmission gate, a second transmission gate, and a third transmission gate;

Input terminals of the first transmission gate, the second transmission gate, and the third transmission gate are all accessing input signals, output terminals are respectively electrically connected to the first data line, the second data line, and the third data line, high potential control terminals are respectively accessing the first control signal, the second control signal, and the third control signal, low potential control terminals are respectively accessing the first inverting control signal, the second inverting control signal, and the third inverting control signal.

Advantageous effects of the present application: the present application provides a demux control circuit, the demux control circuit including a driving chip, a logic circuit, and a demux, the driving chip is for providing two or three pulse signals to the logic circuit, the logic circuit including a plurality of NOR gates and a plurality of buffers, the two pulse signals are converted into three control signals or the three pulse signal are converted into four control signals by combining the NOR gates and the buffers, to achieve outputting a larger number of control signals by a smaller number of pins, thereby reducing the number of pins outputted from the driving chip and reduce production costs.

BRIEF DESCRIPTION OF THE DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts. In the FIG.s.

DETAILED DESCRIPTION OF PREFERRED EMBODIMENTS

Figure 1:
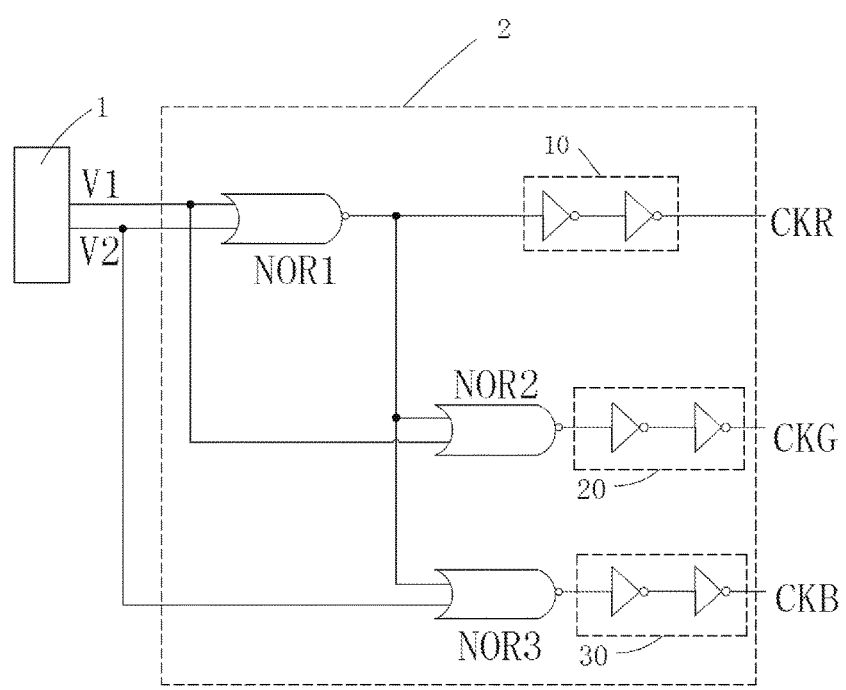
FIG. 1 is a circuit diagram of the demux control circuit of a first embodiment of present application.

The specific structural and functional details disclosed herein are only representative and are intended for describing exemplary embodiments of the disclosure. However, the disclosure can be embodied in many forms of substitution, and should not be interpreted as merely limited to the embodiments described herein.

In the description of the disclosure, terms such as "center", "transverse", "above", "below", "left", "right", "vertical", "horizontal", "top", "bottom", "inside", "outside", etc. for indicating orientations or positional relationships refer to orientations or positional relationships as shown in the drawings; the terms are for the purpose of illustrating the disclosure and simplifying the description rather than indicating or implying the device or element must have a certain orientation and be structured or operated by the certain orientation, and therefore cannot be regarded as limitation with respect to the disclosure. Moreover, terms such as "first" and "second" are merely for the purpose of illustration and cannot be understood as indicating or implying the relative importance or implicitly indicating the number of the technical feature. Therefore, features defined by "first" and "second" can explicitly or implicitly include one or more the features. In the description of the disclosure, unless otherwise indicated, the meaning of "plural" is two or more than two. In addition, the term "comprise" and any variations thereof are meant to cover a non-exclusive inclusion.

In the description of the disclosure, is should be noted that, unless otherwise clearly stated and limited, terms "mounted", "connected with" and "connected to" should be understood broadly, for instance, can be a fixed connection, a detachable connection or an integral connection; can be a mechanical connection, can also be an electrical connection; can be a direct connection, can also be an indirect connection by an intermediary, can be an internal communication of two elements. A person skilled in the art can understand concrete meanings of the terms in the disclosure as per specific circumstances.

The terms used herein are only for illustrating concrete embodiments rather than limiting the exemplary embodiments. Unless otherwise indicated in the content, singular forms "a" and "an" also include plural. Moreover, the terms "comprise" and/or "include" define the existence of described features, integers, steps, operations, units and/or components, but do not exclude the existence or addition of one or more other features, integers, steps, operations, units, components and/or combinations thereof.

The disclosure will be further described in detail with reference to accompanying drawings and preferred embodiments as follows.

Referring to FIG. 1, the present application provides a demux control circuit including a driving chip 1, a logic circuit 2 electrically connected to the driving chip 1, and a demux 3 electrically connected to the logic circuit 2.

Specifically, the driving chip 1 is for providing a first pulse signal V1 and a second pulse signal V2 to the logic circuit 2, and in general, the first pulse signal V1 and the second pulse signal V2 are directly outputted through two pins of the driving chip 1, respectively, that is, the two pins of the driving chip 1 are need to be occupied for outputting the first pulse signal V1 and the second pulse signal V2.

Specifically, as shown in FIG. 1, in the first embodiment of the present application, the logic circuit 2 is for converting the first pulse signal V1 and the second pulse signal V2 into three control signals, to realize outputting three control signals by the two pins of the driving chip 1, thereby reducing the number of pins occupied by the control signals and reducing the production cost.

In detail, in the first embodiment of the present application, the logic circuit 2 includes a first two-input NOR gate NOR1, a second two-input NOR gate NOR2, a third two-input NOR gate NOR3, a first in-phase buffer 10, a second in-phase buffer 20, and a third in-phase buffer 30.

Wherein a first input terminal and a second input terminal of the first two-input NOR gate NOR1 are respectively accessing the first pulse signal V1 and the second pulse signal V2, and an output terminal is electrically connected to an input terminal of the first in-phase buffer 10; a first input terminal of the second two-input NOR gate NOR2 is accessing the first pulse signal V1, a second input terminal is electrically connected to the output terminal of the first two-input NOR gate NOR1, and an output terminal is electrically connected to an input terminal of the second in-phase buffer 20; a first input terminal of the third two-input NOR gate NOR3 is accessing the second pulse signal V2, and a second input terminal is electrically connected to the output terminal of the first two-input NOR gate NOR1, an output terminal is electrically connected to an input terminal of the third in-phase buffer 30; output terminals of the first in-phase buffer 10, the second in-phase buffer 20 and the third in-phase buffer 30 output a first control signal CKR, a second control signal CKG, and a third control signal CKB to the demux 3, respectively.

Figure 2:
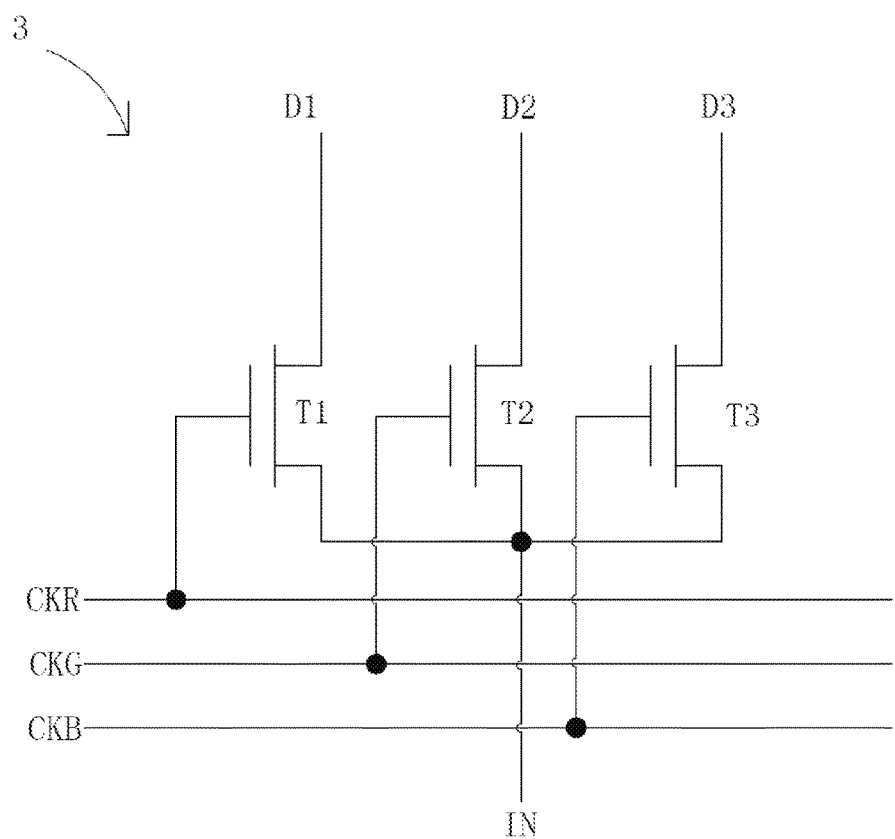
FIG. 2 is a circuit diagram of a demux corresponding to the demux control circuit of the first embodiment of present application.

Further, as shown in FIG. 2, the demux control circuit of the present application further includes a first data line D1, a second data line D2, and a third data line D3; the demux 3 includes a first thin film transistor T1, a second thin film transistor T2, and a third thin film transistor T3; sources of the first thin film transistor T1, the second thin film transistor T2, and the third thin film transistor T3 are is accessing input signals IN, drains of the first thin film transistor T1, the second thin film transistor T2, and the third thin film transistor T3 are electrically connected to the first data line D1, the second data line D2, and the third data line D3, gates of the first thin film transistor T1, the second thin film transistor T2, and the third thin film transistor T3 accesses the first control signal CKR, the second control signal CKG, and the third control signal CKB, respectively. In general, the input signals IN are also output by a pin of the driving chip 1.

Figure 3:
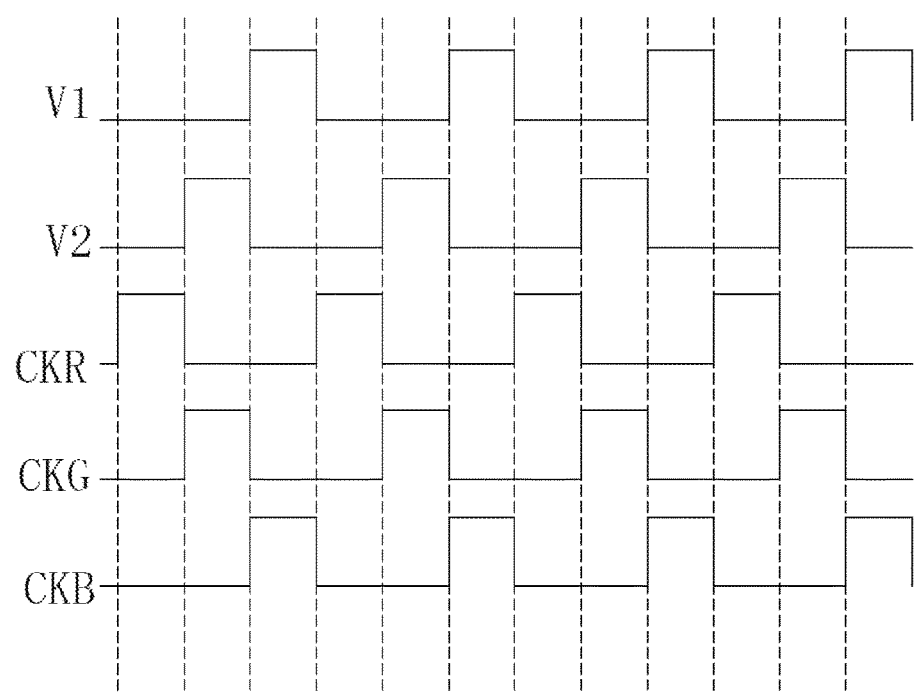
FIG. 3 is a signal waveform diagram of the demux control circuit of the first embodiment of present application.

It should be noted that, referring to FIG. 3, in the first embodiment of the present application, the combination of the potentials of the first pulse signal V1 and the second pulse signal V2 generates a plurality of successive signal output cycles, each of the signal output cycle respectively includes: a first stage, a second stage, and a third stage conducted successively;

In the first stage, both the first pulse signal V1 and the second pulse signal V2 are at low potential, the output terminal of the first two-input NOR gate NOR1 outputs high potential, the output terminal of the second two-input NOR gate NOR1 outputs low potential, the output terminal of the third two-input NOR gate NOR3 outputs low potential, the output terminals of the first in-phase buffer 10, the second in-phase buffer 20 and the third in-phase buffer 30 output the first control signal CKR with high potential, the second control signal CKG with low potential, and the third control signal CKB with low potential respectively to the demux 3;

In the second stage, the first pulse signal V1 is at low potential, the second pulse signal V2 is at high potential, the output terminal of the first two-input NOR gate NOR1 outputs low potential, the output terminal of the second two-input NOR gate NOR2 outputs high potential, the output terminal of the third two-input NOR gate NOR3 outputs low potential, the output terminal of the third two-input NOR gate NOR3 outputs low potential, the output terminals of the first in-phase buffer 10, the second in-phase buffer 20 and the third in-phase buffer 30 output the first control signal CKR with low potential, the second control signal CKG with high potential, and the third control signal CKB with low potential respectively to the demux 3;

In the third stage, the first pulse signal V1 is at high potential, the second pulse signal V2 is at low potential, the output terminal of the first two-input NOR gate NOR1 outputs low potential, the output terminal of the second two-input NOR gate NOR2 outputs high potential, the output terminal of the third two-input NOR gate NOR3 outputs low potential, the output terminal of the third two-input NOR gate NOR3 outputs low potential, the output terminals of the first in-phase buffer 10, the second in-phase buffer 20 and the third in-phase buffer 30 output the first control signal CKR with low potential, the second control signal CKG with low potential, and the third control signal CKB with high potential respectively to the demux 3.

Figure 4:
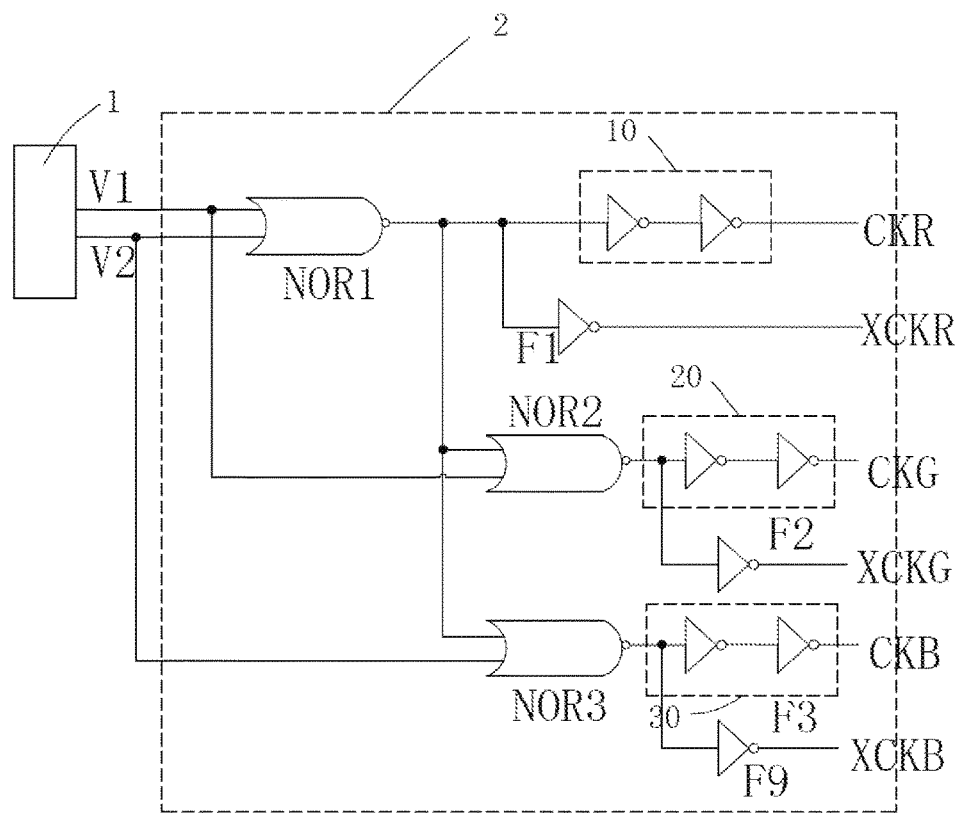
FIG. 4 is a circuit diagram of the demux control circuit of a second embodiment of present application.
Figure 5:
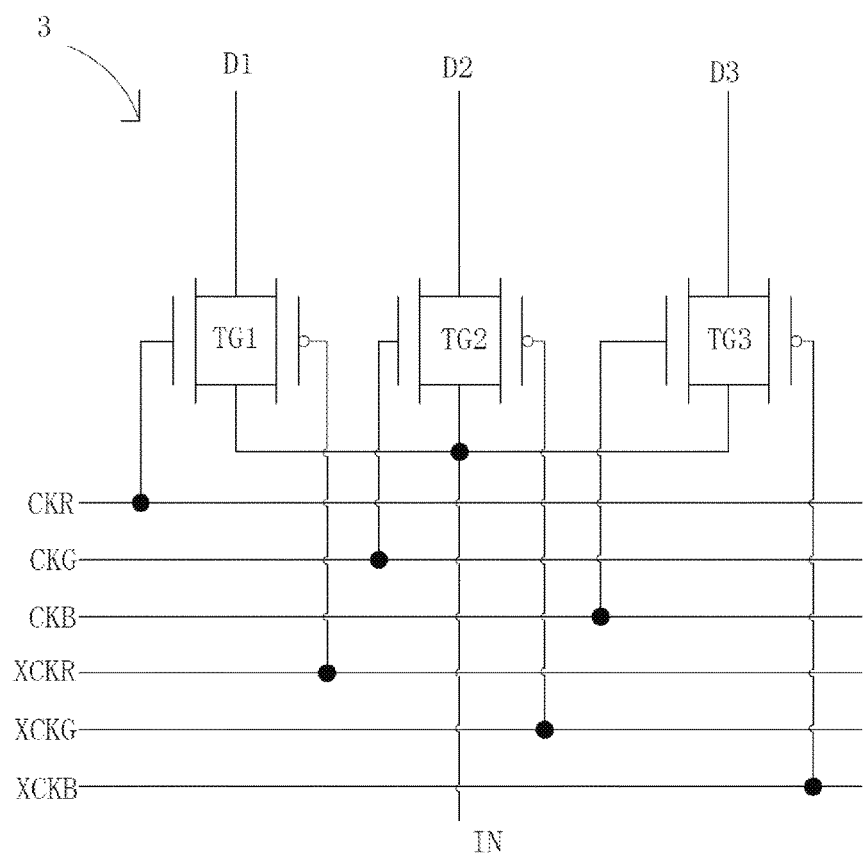
FIG. 5 is a circuit diagram of a demux corresponding to the demux control circuit of the second embodiment of present application.

Referring to FIGS. 4 and 5, FIGS. 4 and 5 show a second embodiment of the present application, the difference between the second embodiment and the first embodiment of the present application is the second embodiment of the present application employs a demux controlled by transmission gates, since each of the transmission gates requires two control signals, therefore, the second embodiment of the present application need to convent the first pulse signals V1 and the second pulse signal V2 into three control signals and three inverting control signals. In the first embodiment, the three control signals have been obtained, therefore, a circuit of the second embodiment of the present application is improved on the basis of the first embodiment, and specifically, a first inverter F1, a second inverter F2, and a third inverter F3 are added to the logic circuit 2.

Wherein an input terminal of the first inverter F1 is electrically connected to the output terminal of the first two-input NOR gate NOR1, an output terminal of the first inverter F1 outputs a first inverting control signal XCKR to the demux 3; an input terminal of the second inverter F2 is electrically connected to the output terminal of the second two-input NOR gate NOR2, an output terminal of the second inverter F2 outputs a second inverting control signal XCKG to the demux 3; an input terminal of the third inverter F3 is electrically connected to the output terminal of the third two-input NOR gate NOR3, an output terminal of the third inverter F3 outputs a third inverting control signal XCKB to the demux 3.

In detail, as shown in FIG. 5, in the second embodiment of the present application, the demux 3 includes: a first transmission gate TG1, a second transmission gate TG2, and a third transmission gate TG3; input terminals of the first transmission gate TG1, the second transmission gate TG2, and the third transmission gate TG3 are all accessing the input signal IN, output terminals are electrically connected to the first data line D1, the second data line D2, and the third data line D3, respectively, high potential control terminals accesses the first control signal CKC, the second control signal CKG, and the third control signal CKB, respectively, low potential control terminals are connected to the first inverting control signal XCKR, the second inverting control signal XCKG, and the third inverting control signal XCKB, respectively.

Figure 6:
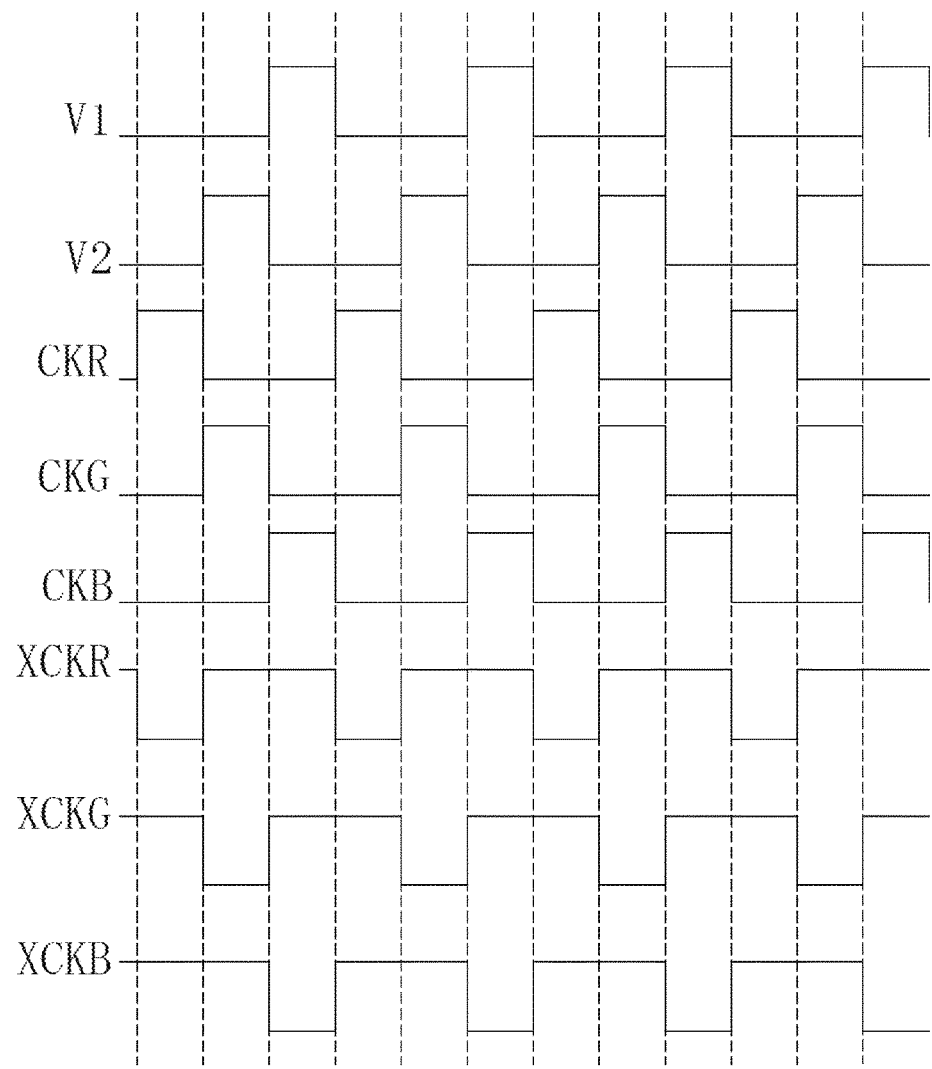
FIG. 6 is a signal waveform diagram of the demux control circuit of the second embodiment of present application.

Further, as shown in FIG. 6, in the second embodiment of the present application, the operation process of the demux control circuit is the same as the operation process of the first embodiment excepting for respectively outputting the first inverting control signal XCKR, the second inverting control signal XCKG, and the third inverting control signal XCKB with opposite in phase to the first control signal CKR, the second control signal CKG and the third control signal CKB in every stage.

Preferably, the first in-phase buffer 10, the second in-phase buffer 20, and the third in-phase buffer 30 each includes an even number of sequentially connected inverters, and more preferably, as shown in FIG. 1 or FIG. 4, the first in-phase buffer 10, the second in-phase buffer 20, and the third in-phase buffer 30 each includes two series-connected inverters.

In the first and second embodiments of the present application, the demux has one input and three output terminals, the demux is mainly applied to a three-color display, such as a display with red, green and blue three sub-pixels display, with the development of display technology, the market has emerged four-color display with better display performance compared to the three-color display, such as a display with red, green, blue and white four sub-pixels display, the demux employed in the four-color display typically includes one input and four output terminals, i.e., at least four control signals are required to complete the control of the demux, in the present application, the third and fourth embodiments have been proposed on the basis of the first and second embodiments, the third and fourth embodiments are capable of converting the three pulse signals supplied from the driving chip into four control signals, or four control signals and four inverting control signals to complete the control of the demux of the four-color display.

Figure 7:
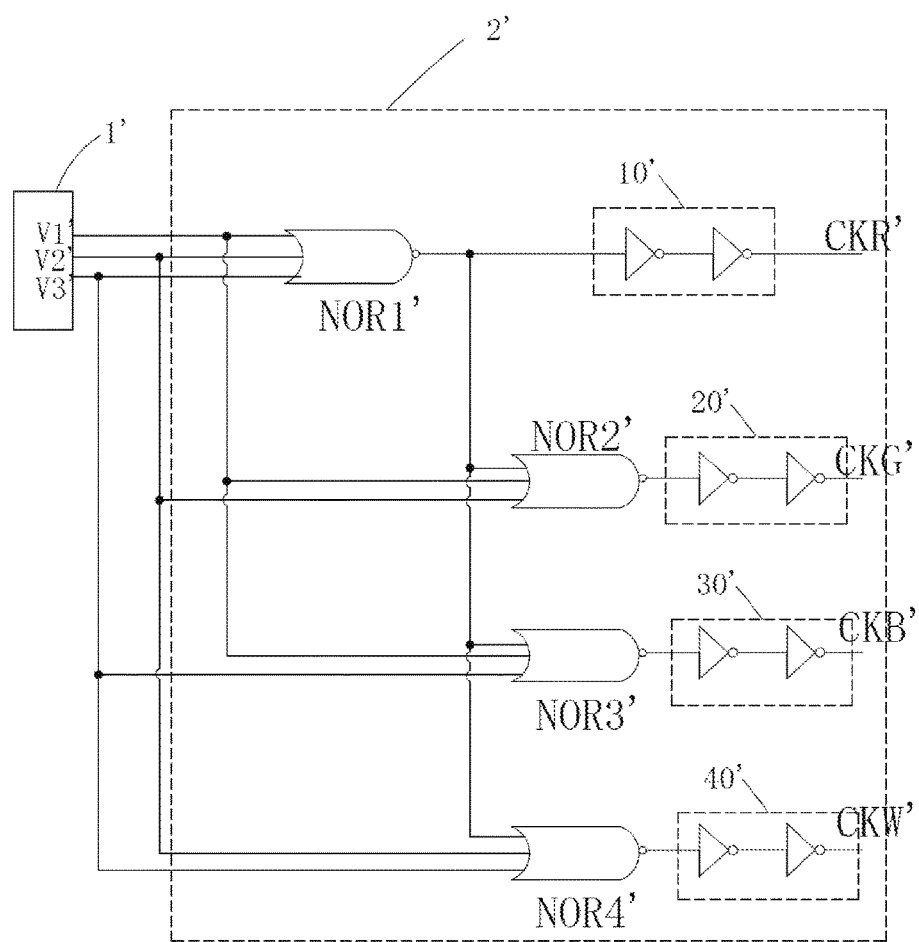
FIG. 7 is a circuit diagram of the demux control circuit of a third embodiment of present application.

Specifically, as shown in FIG. 7, a demux control circuit is provided in the third embodiment of the present application including a driving chip 1', a logic circuit 2' electrically connected to the driving chip 1' and a demux 3' electrically connected to the logic circuit 2'.

Wherein the driving chip 1' is for providing the first pulse signal V1', the second pulse signal V2', and the third pulse signal V3' to the logic circuit 2' to realize the output of the four control signals by the three pins of the driving chip 1', thereby reducing the number of pins occupied by the control signal and reducing the cost of production.

In particular, the logic circuit 2' includes a first three-input NOR gate NOR1', a second three-input NOR gate NOR2', a third three-input NOR gate NOR3', a fourth three-input NOR gate NOR4', a first in-phase buffer 10', a second in-phase buffer 20', a third in-phase buffer 30', and a fourth in-phase buffer 40'.

A first input terminal, a second input terminal, and a third input terminal of the first three-input NOR gate NOR1' are respectively accessing the first pulse signal V1', the second pulse signal V2', and the third pulse signal V3', an output terminal is electrically connected to an input terminal of the first in-phase buffer 10'; a first input terminal and a second input terminal of the second three-input NOR gate NOR2' are respectively accessing the first pulse signal V1' and the second pulse signal V2', a third input terminal is electrically connected to the output terminal of the first three-input NOR gate NOR1', an output terminal is electrically connected to an input terminal of the second in-phase buffer 20'; a first input terminal and a second input terminal of the third three-input NOR gate NOR3' are respectively accessing the first pulse signal V1' and the third pulse signal V3', a third input terminal is electrically connected to the output terminal of the first three-input NOR gate NOR1', an output terminal is electrically connected to the input terminal of the third in-phase buffer 30'; a first input terminal and a second input terminal of the fourth three-input NOR gate NOR4' are respectively connected to the second pulse signal V2' and the third pulse signal V3', a third input terminal is electrically connected to the output terminal of the first three-input NOR gate NOR1', the output terminal is electrically connected to an input terminal of the fourth in-phase buffer 40'.

Output terminals of the first in-phase buffer 10', the second in-phase buffer 20', the third in-phase buffer 30', and the fourth in-phase buffer 40' are respectively output the first control signal CKR', the second control signal CKG', the third control signal CKB', and the fourth control signal CKW' to the demux 3'.

Figure 8:
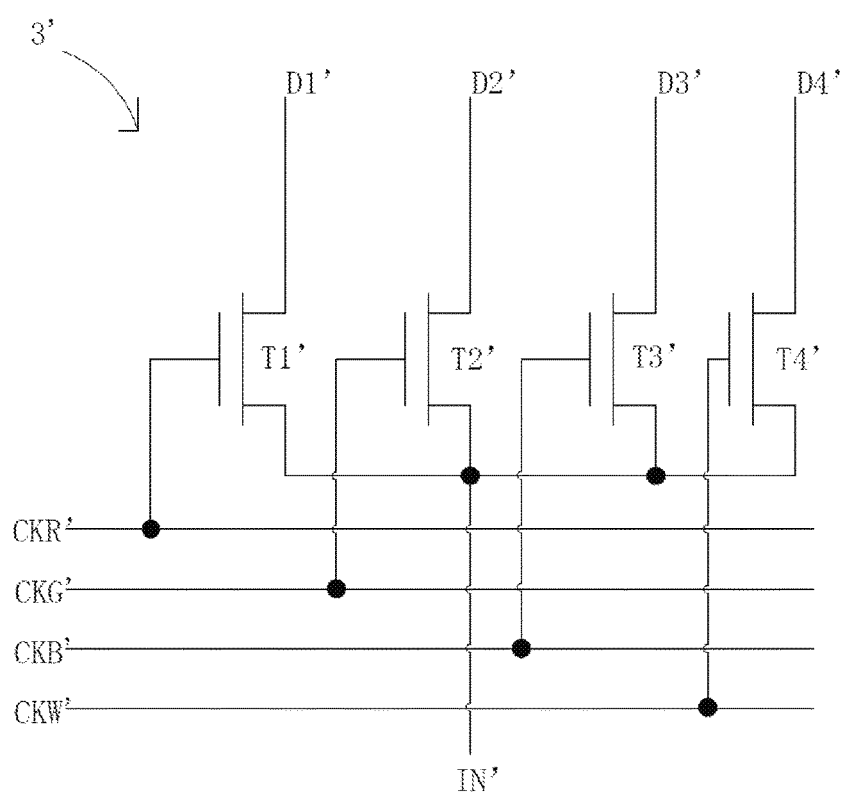
FIG. 8 is a circuit diagram of a demux corresponding to the demux control circuit of the third embodiment of present application.

Further, as shown in FIG. 8, in the third embodiment of the present application, the demux control circuit further includes: a first data line D1', a second data line D2', a third data line D3', and a fourth data line D4'; the demux 3' includes: a first thin film transistor T1', a second thin film transistor T2', a third thin film transistor T3', and a fourth thin film transistor T4'; sources of the first thin film transistor T1', the second thin film transistor T2', the third thin film transistor T3', and the fourth thin film transistor T4' are all accessing the input signal IN', drains are respectively electrically connected to the first data line D1', the second data line D2', the third data line D3', and the fourth data line D4', the gates are respectively accessing the first control signal CKR', the second control signal CKG', the third control signal CKB' and the fourth control signal CKW'. In general, the input signal IN' is also output by a pin of the driving chip 1'.

Figure 9:
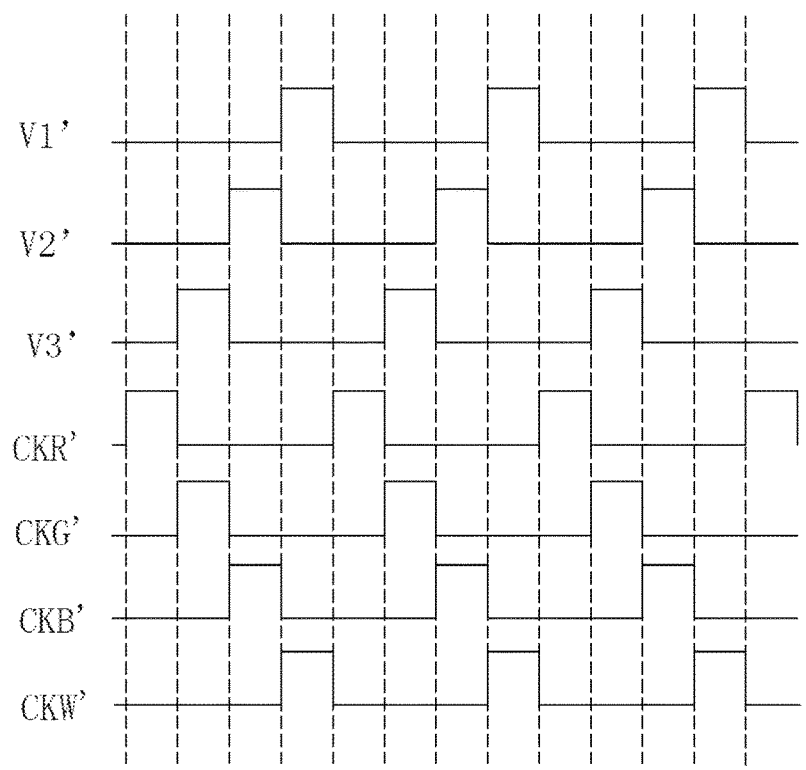
FIG. 9 is a signal waveform diagram of the demux control circuit of the third embodiment of present application.

Referring to FIG. 9, in the third embodiment of the present application, the combination of the potentials of the first pulse signal V1', the second pulse signal V2' and the third pulse signal V3' generates a plurality of successive signal output cycles, each of the signal output cycle respectively includes: a first stage, a second stage, a third stage and a fourth stage conducted successively;

In the first stage, the first pulse signal V1', the second pulse signal V2', and the third pulse signal V3' are all at low potential, the first three-input NOR gate NOR1' outputs high potential, the second three-input NOR gate NOR2' outputs low potential, the third three-input NOR gate NOR3' outputs low potential, the fourth three-input NOR gate NOR4' outputs low potential, the output terminals of the first in-phase buffer 10', the second in-phase buffer 20', the third in-phase buffer 30', and the fourth in-phase buffer 40' respectively output the first control signal CKR' with high potential, the second control signal CKG' with low potential, the third control signal CKB' with low potential, and the fourth control signal CKW' with low potential to the demux 3'.

In the second stage, both the first pulse signal V1' and the second pulse signal V2' are at low potential, the third pulse signal V3' is at high potential, the first three-input NOR gate NOR1' outputs low potential, the second three-input NOR gate NOR2' outputs high potential, the third three-input NOR gate NOR3' outputs low potential, the fourth three-input NOR gate NOR4' outputs low potential, the output terminals of the first in-phase buffer 10', the second in-phase buffer 20', the third in-phase buffer 30', and the fourth in-phase buffer 40' respectively output the first control signal CKR' with low potential, the second control signal CKG' with high potential, the third control signal CKB' with low potential, and the fourth control signal CKW' with low potential to the demux 3'.

In the third stage, both the first pulse signal V1' and the third pulse signal V3' are at low potential, the second pulse signal V2' is at high potential, the first three-input NOR gate NOR1' outputs low potential, the second three-input NOR gate NOR2' outputs low potential, the third three-input NOR gate NOR3' outputs high potential, the fourth three-input NOR gate NOR4' outputs low potential, the output terminals of the first in-phase buffer 10', the second in-phase buffer 20', the third in-phase buffer 30', and the fourth in-phase buffer 40' respectively output the first control signal CKR' with low potential, the second control signal CKG' with low potential, the third control signal CKB' with high potential, and the fourth control signal CKW' with low potential to the demux 3'.

In the fourth stage, both the third pulse signal V3' and the second pulse signal V2' are at low potential, the first pulse signal V1' is at high potential, the first three-input NOR gate NOR1' outputs low potential, the second three-input NOR gate NOR2' outputs low potential, the third three-input NOR gate NOR3' outputs low potential, the fourth three-input NOR gate NOR4' outputs high potential, the output terminals of the first in-phase buffer 10', the second in-phase buffer 20', the third in-phase buffer 30', and the fourth in-phase buffer 40' respectively output the first control signal CKR' with low potential, the second control signal CKG' with low potential, the third control signal CKB' with low potential, and the fourth control signal CKW' with high potential to the demux 3'.

Figure 10:
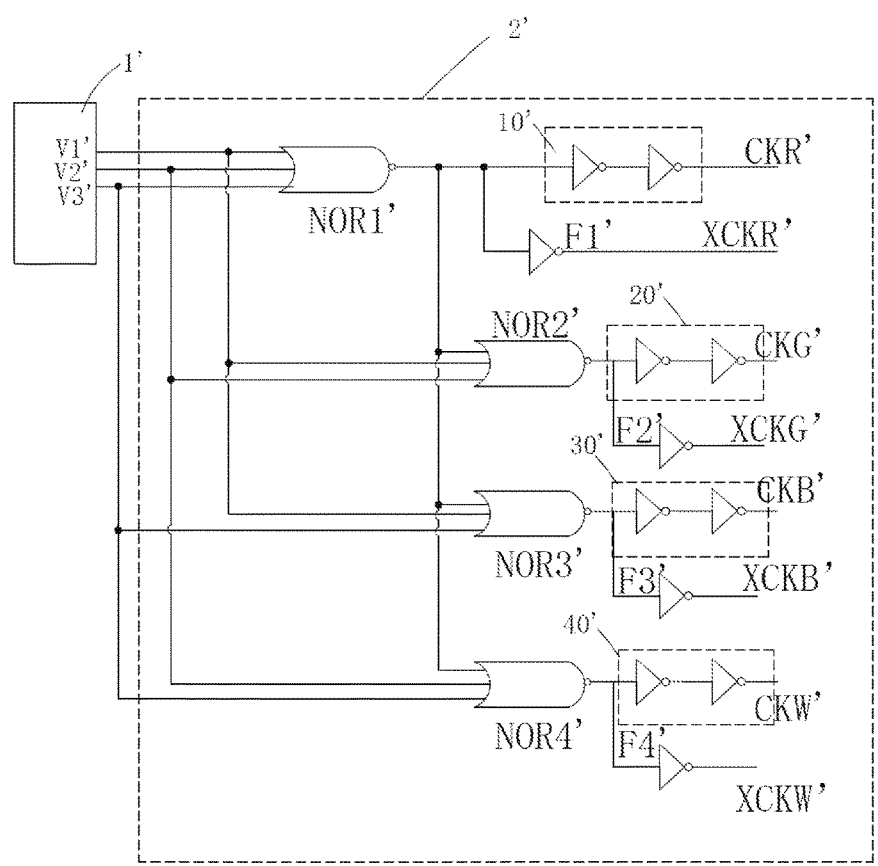
FIG. 10 is a circuit diagram of the demux control circuit of a fourth embodiment of present application.
Figure 11:
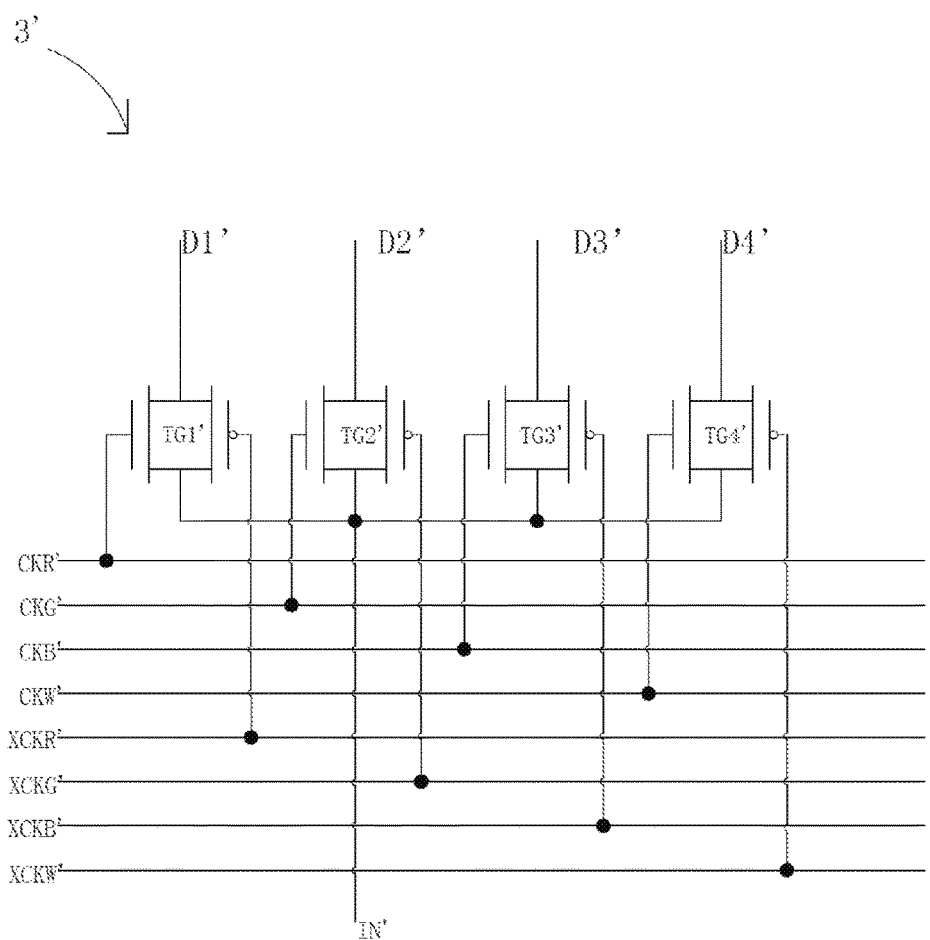
FIG. 11 is a circuit diagram of a demux corresponding to the demux control circuit of the fourth embodiment of present application.

In addition, referring to FIGS. 10 and 11, FIG. 10 and FIG. 11 are a fourth embodiment of the present application. The difference between the fourth embodiment and the third embodiment is that the fourth embodiment of the present application employs a demux controlled by transmission gates, since each of the transmission gates requires two control signals, therefore, the fourth embodiment of the present application need to convent the first pulse signals V1', the second pulse signal V2' and the third pulse signal V3' into four control signals and four inverting control signals. In the third embodiment, the four control signals have been obtained, therefore, a circuit of the fourth embodiment of the present application is improved on the basis of the third embodiment, and specifically, a first inverter F1', a second inverter F2', a third inverter F3' and a fourth inverter F4' are added to the logic circuit 2. Wherein, an input terminal of the first inverter F1' is electrically connected to the output terminal of the first three-input NOR gate NOR1', and an output terminal of the first inverter F1' outputs a first inverting control signal XCKR' to the demux 3'; an input terminal of the second inverter F2' is electrically connected to the output terminal of the second three-input NOR gate NOR2', an output terminal of the second inverter F2' outputs a second inverting control signal XCKG' to the demux 3'; an input of the third inverter F3' is electrically connected to the output terminal of the third three-input NOR gate NOR3', an output terminal of the third inverter F3' outputs a third inverting control signal XCKB' to the demux 3'; an input terminal of the fourth inverter F4' is electrically connected to the fourth three-input NOR gate NOR4', an output terminal of the fourth inverter F4' outputs a fourth inverting control signal XCKW' to the demux 3'.

In detail, in the fourth embodiment of the present application, the demux 3' includes: a first transmission gate TG1', a second transmission gate TG2', a third transmission gate TG3', and a fourth transmission gate TG4'; input terminals of the first transmission gate TG1', the second transmission gate TG2', the third transmission gate TG3', and the fourth transmission gate TG4' are all accessing the input signal IN', output terminals are respectively electrically connected to the first data line D1', the second data line D2', the third data line D3', and the fourth data line D4', high potential control terminals are respectively accessing the first control signal CKR', the second control signal CKG', the third control signal CKB', and the fourth control signal CKW', low potential control terminals are respectively connected to the first inverting control signal XCKR', the second inverting control signal XCKG', the third inverting control signal XCKB', and Fourth inverting control signal XCKW'.

Figure 12:
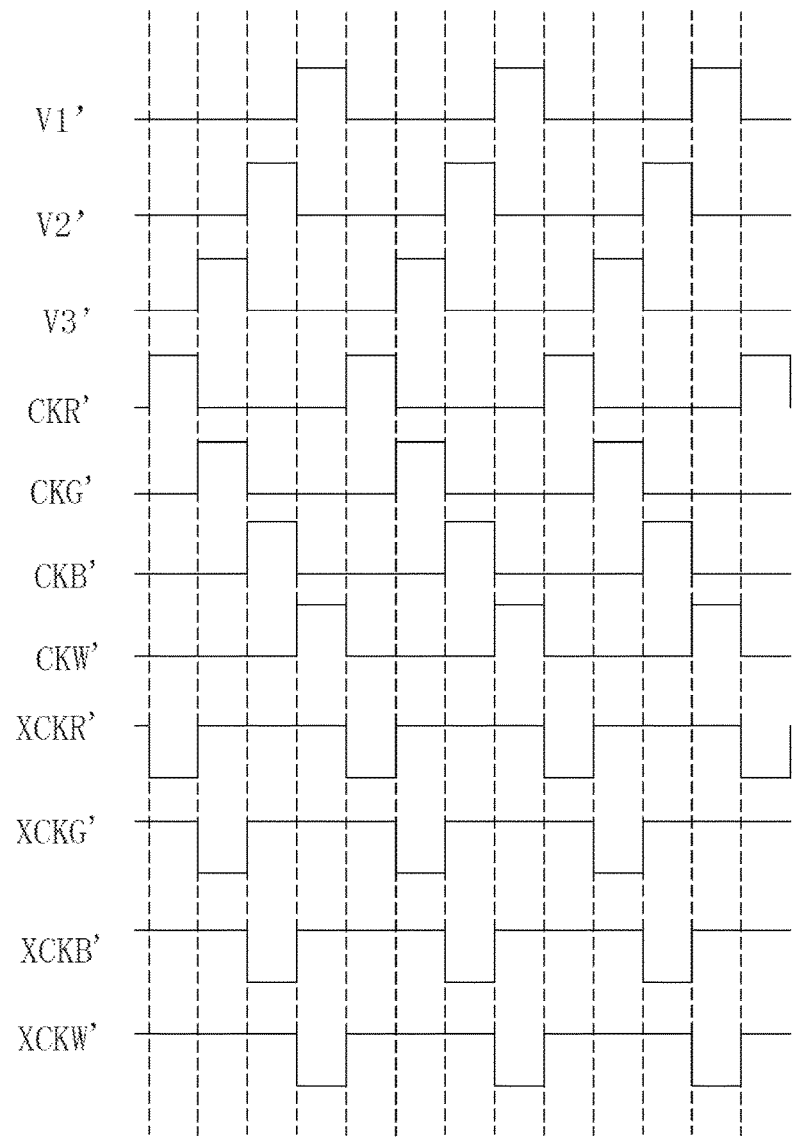
FIG. 12 is a signal waveform diagram of the demux control circuit of the fourth embodiment of present application.

As shown in FIG. 12, in the fourth embodiment of the present application, the operation process of the demux control circuit is the same as the operation process of the third embodiment excepting for respectively outputting the first inverting control signal XCKR', the second inverting control signal XCKG', the third inverting control signal XCKB' and the fourth inverting control signal XCKW' with opposite in phase to the first control signal CKR', the second control signal CKG', the third control signal CKB' and the fourth control signal CKW' in every stage.

In particular, the demux control circuit of the present application can be used to drive various display devices such as liquid crystal displays and organic light emitting diode displays.

In view of the above, the present application provides a demux control circuit, the demux control circuit includes a driving chip, a logic circuit, and a demux, the driving chip is for providing two or three pulse signals to the logic circuit, the logic circuit includes a plurality of NOR gates and a plurality of buffers capable of converting two pulse signals into three control signals, or converting three pulse signals into four control signals through the cooperation of the NOR gates and the buffers to achieve outputting a larger number of control signals by a smaller number of pins, thereby reducing the number of pins outputted from the driving chip and reduce production costs.

The foregoing contents are detailed description of the disclosure in conjunction with specific preferred embodiments and concrete embodiments of the disclosure are not limited to these description. For the person skilled in the art of the disclosure, without departing from the concept of the disclosure, simple deductions or substitutions can be made and should be included in the protection scope of the application.

What is claimed is:

1. A demux control circuit, comprising:
a driving chip, a logic circuit electrically connected to the driving chip, and a demux electrically connected to the logic circuit;
the driving chip for providing a first pulse signal and a second pulse signal to the logic circuit;
the logic circuit comprising a first two-input NOR gate, a second two-input NOR gate, a third two-input NOR gate, a first in-phase buffer, a second in-phase buffer, and a third in-phase buffer;
a first input terminal and a second input terminal of the first two-input NOR gate respectively accessing the first pulse signal and the second pulse signal, an output terminal electrically connected to an input terminal of the first in-phase buffer; a first input terminal of the second two-input NOR gate accessing the first pulse signal, a second input terminal electrically connected to the output terminal of the first two-input NOR gate, an output terminal electrically connected to an input terminal of the second in-phase buffer; a first input terminal of the third two-input NOR gate accessing the second pulse signal, a second input terminal electrically connected to the output terminal of the first two-input NOR gate, an output terminal electrically connected to an input terminal of the third in-phase buffer; and
output terminals of the first in-phase buffer, the second in-phase buffer and the third in-phase buffer respectively outputting a first control signal, a second control signal, and a third control signal to the demux.

2. The demux control circuit according to claim 1, wherein the logic circuit further comprises a first inverter, a second inverter, and a third inverter; and
an input terminal of the first inverter is electrically connected to the output terminal of the first two-input NOR gate, an output terminal of the first inverter outputs a first inverting control signal to the demux; an input terminal of the second inverter is electrically connected to the output terminal of the second two-input NOR gate, an output terminal of the second inverter outputs a second inverting control signal to the demux; an input terminal of the third inverter is electrically connected to the output terminal of the third two-input NOR gate, an output terminal of the third inverter outputs a third inverting control signal to the demux.

3. The demux control circuit according to claim 1, wherein the demux control circuit further comprises a first data line, a second data line, and a third data line;
The demux comprises a first thin film transistor, a second thin film transistor, and a third thin film transistor; and
sources of the first thin film transistor, the second thin film transistor, and the third thin film transistor are all accessing input signals, drains of the first thin film transistor, the second thin film transistor, and the third thin film transistor are respectively electrically connected to the first data line, the second data line, and the third data line, gates of the first thin film transistor, the second thin film transistor, and the third thin film transistor are respectively accessing the first control signal, the second control signal, and the third control signal.

4. The demux control circuit according to claim 2, wherein the demux control circuit further comprises a first data line, a second data line, and a third data line;
The demux comprises a first transmission gate, a second transmission gate, and a third transmission gate; and
input terminals of the first transmission gate, the second transmission gate, and the third transmission gate are all accessing the input signals, output terminals are respectively electrically connected to the first data line, the second data line, and the third data line, high potential control terminals are respectively accessing the first control signal, the second control signal, and the third control signal, low potential control terminals are respectively accessing the first inverting control signal, the second inverting control signal, and the third inverting control signal.

5. The demux control circuit according to claim 1, wherein a combination of the potentials of the first pulse signal and the second pulse signal generates a plurality of successive signal output cycles, each of the signal output cycle respectively comprises a first stage, a second stage, and a third stage conducted successively;
in the first stage, both the first pulse signal and the second pulse signal are at low potential, the first control signal is at high potential, the second control signal and the third control signal are at low potential;
in the second stage, the first pulse signal is at low potential, the second pulse signal is at high potential, the second control signal is at high potential, the first control signal and the third control signal are at low potential; and
in the third stage, the first pulse signal is at high potential, the second pulse signal is at low potential, the third control signal is at high potential, the first control signal and the second control signal are at low potential.

6. A demux control circuit, comprising:
a driving chip, a logic circuit electrically connected to the driving chip, and a demux electrically connected to the logic circuit;
the driving chip for providing a first pulse signal, a second pulse signal and a third pulse signal to the logic circuit;
the logic circuit comprising a first three-input NOR gate, a second three-input NOR gate, a third three-input NOR gate, a fourth three-input NOR gate, a first in-phase buffer, a second in-phase buffer, a third in-phase buffer, and a fourth in-phase buffer;
a first input terminal, a second input terminal, and a third input terminal of the first three-input NOR gate respectively accessing the first pulse signal, the second pulse signal, and the third pulse signal, an output terminal electrically connected to an input terminal of the first in-phase buffer; a first input terminal and a second input terminal of the second three-input NOR gate respectively accessing the first pulse signal and the second pulse signal, a third input terminal electrically connected to the output terminal of the first three-input NOR gate, an output terminal electrically connected to an input terminal of the second in-phase buffer, a first input terminal and a second input terminal of the third three-input NOR gate respectively accessing the first pulse signal and the third pulse signal, a third input terminal electrically connected to the output terminal of the first three-input NOR gate, an output terminal electrically connected to an input terminal of the third in-phase buffer a first input terminal and a second input terminal of the fourth three-input NOR gate respectively accessing the second pulse signal and the third pulse signal, a third input terminal electrically connected to the output terminal of the first three-input NOR gate, an output terminal electrically connected to an input terminal of the fourth in-phase buffer; and
output terminals of the first in-phase buffer, the second in-phase buffer, the third in-phase buffer, and the fourth in-phase buffer respectively outputting a first control signal, a second control signal, a third control signal, and a fourth control signal to the demux.

7. The demux control circuit according to claim 6, wherein the logic circuit further comprises a first inverter, a second inverter, a third inverter and a fourth inverter; and
an input terminal of the first inverter is electrically connected to the output terminal of the first three-input NOR gate, an output terminal of the first inverter outputs a first inverting control signal to the demux; an input terminal of the second inverter is electrically connected to the output terminal of the second three-input NOR gate, an output terminal of the second inverter outputs a second inverting control signal to the demux; an input of the third inverter is electrically connected to the output terminal of the third three-input NOR gate, an output terminal of the third inverter outputs a third inverting control signal to the demux; an input terminal of the fourth inverter is electrically connected to the fourth three-input NOR gate, an output terminal of the fourth inverter outputs a fourth inverting control signal to the demux.

8. The demux control circuit according to claim 6, wherein the demux control circuit further comprises a first data line, a second data line, a third data line, and a fourth data line;

The demux comprises a first thin film transistor, a second thin film transistor, a third thin film transistor, and a fourth thin film transistor; and
sources of the first thin film transistor, the second thin film transistor, the third thin film transistor, and the fourth thin film transistor are all accessing input signals, drains are respectively electrically connected to the first data line, the second data line, the third data line, and the fourth data line, gates are respectively accessing the first control signal, the second control signal, the third control signal and the fourth control signal.

9. The demux control circuit according to claim 7, wherein the demux control circuit further comprises a first data line, a second data line, a third data line, and a fourth data line;
the demux comprises a first transmission gate, a second transmission gate, a third transmission gate, and a fourth transmission gate;
input terminals of the first transmission gate, the second transmission gate, the third transmission gate, and the fourth transmission gate are all accessing input signals, output terminals are respectively electrically connected to the first data line, the second data line, the third data line, and the fourth data line, high potential control terminals are respectively accessing the first control signal, the second control signal, the third control signal, and the fourth control signal, low potential control terminals are respectively accessing the first inverting control signal, the second inverting control signal, the third inverting control signal, and the fourth inverting control signal.

10. The demux control circuit according to claim 6, wherein a combination of the potentials of the first pulse signal, the second pulse signal and the third pulse signal generates a plurality of successive signal output cycles, each of the signal output cycle respectively comprises a first stage, a second stage, a third stage, and a fourth stage conducted successively;
in the first stage, all of the first pulse signal, the second pulse signal and the third pulse signal are at low potential, the first control signal is at high potential, the second control signal, the third control signal and the fourth control signal are at low potential;
in the second stage, the first pulse signal and the second pulse signal are at low potential, the third pulse signal is at high potential, the second control signal is at high potential, the first control signal, the third control signal and the fourth control signal are at low potential;
in the third stage, the first pulse signal and the third pulse signal are at low potential, the second pulse signal is at high potential, the third control signal is at high potential, the first control signal, the second control signal and the fourth control signal are at low potential; and
in the fourth stage, the second pulse signal and the third pulse signal are at low potential, the first pulse signal is at high potential, the fourth control signal is at high potential, the first control signal, the second control signal and the third control signal are at low potential.

11. A demux control circuit, comprising:
a driving chip, a logic circuit electrically connected to the driving chip, and a demux electrically connected to the logic circuit;
the driving chip for providing a first pulse signal and a second pulse signal to the logic circuit;
the logic circuit comprising a first two-input NOR gate, a second two-input NOR gate, a third two-input NOR gate, a first in-phase buffer, a second in-phase buffer, and a third in-phase buffer;

a first input terminal and a second input terminal of the first two-input NOR gate respectively accessing the first pulse signal and the second pulse signal, an output terminal electrically connected to an input terminal of the first in-phase buffer; a first input terminal of the second two-input NOR gate accessing the first pulse signal, a second input terminal electrically connected to the output terminal of the first two-input NOR gate, and an output terminal electrically connected to an input terminal of the second in-phase buffer, a first input terminal of the third two-input NOR gate accessing the second pulse signal, and a second input terminal electrically connected to the output terminal of the first two-input NOR gate, an output terminal electrically connected to an input terminal of the third in-phase buffer;

output terminals of the first in-phase buffer, the second in-phase buffer and the third in-phase buffer respectively outputting a first control signal, a second control signal, and a third control signal to the demux; and wherein the logic circuit further comprises a first inverter, a second inverter, and a third inverter;

an input terminal of the first inverter is electrically connected to the output terminal of the first two-input NOR gate, an output terminal of the first inverter outputs a first inverting control signal to the demux; an input terminal of the second inverter is electrically connected to the output terminal of the second two-input NOR gate, an output terminal of the second inverter outputs a second inverting control signal to the demux; an input terminal of the third inverter is electrically connected to the output terminal of the third two-input NOR gate, an output terminal of the third inverter outputs a third inverting control signal to the demux;

the demux control circuit further comprises a first data line, a second data line, and a third data line;

the demux further comprises a first transmission gate, a second transmission gate, and a third transmission gate;

input terminals of the first transmission gate, the second transmission gate, and the third transmission gate are all accessing input signals, output terminals are respectively electrically connected to the first data line, the second data line, and the third data line, high potential control terminals are respectively accessing the first control signal, the second control signal, and the third control signal, low potential control terminals are respectively accessing the first inverting control signal, the second inverting control signal, and the third inverting control signal.

* * * * *